United States Patent [19]

Knobbe et al.

[11] Patent Number: 4,751,472
[45] Date of Patent: Jun. 14, 1988

[54] HIGH FREQUENCY AMPLIFIER

[75] Inventors: Karl H. Knobbe, Ellerbek; Hellmut Nöldge, Hamburg, both of Fed. Rep. of Germany

[73] Assignee: Herfurth GmbH, Fed. Rep. of Germany

[21] Appl. No.: 924,521

[22] Filed: Oct. 29, 1986

[30] Foreign Application Priority Data

Nov. 19, 1985 [EP] European Pat. Off. ............ 85114674

[51] Int. Cl.$^4$ ............................................. H03F 3/28
[52] U.S. Cl. ...................................... 330/127; 330/118
[58] Field of Search ................... 330/118, 127, 207 A, 330/128

[56] References Cited

U.S. PATENT DOCUMENTS

| | | | |
|---|---|---|---|
| 2,928,051 | 3/1960 | Young, Jr. ........................... | 330/128 |
| 3,365,675 | 1/1968 | Gaddy et al. ....................... | 330/192 |
| 3,566,236 | 2/1971 | Johnson .............................. | 330/118 |

FOREIGN PATENT DOCUMENTS 1492932  5/1966  France .

OTHER PUBLICATIONS

W. Schminke, "High–Power Amplifiers for Plasma Heating," (8011 Brown Boveri Review 71 (1984) Jun.-/Jul. No. 6/7, Baden, Switzerland, pp. 272–276.

*Primary Examiner*—Gene Wan
*Attorney, Agent, or Firm*—Beveridge, DeGrandi & Weilacher

[57] ABSTRACT

The invention relates to a high frequency amplifier for coupling a load with a tetrode which is used as the amplifier tube and which is provided with a regulating circuit with a set point adjuster for the anode voltage. The regulating circuit can also be influenced by a control variable as the set point feedforward which is dependent on the tetrode screen grid current and which is used for automatically matching the anode voltage to the operating conditions of the load. For the power dissipation of the screen grid and anode of the tetrode, a regulating circuit can be provided with a limitation of the controlling high frequency power dependent on the screen grid current.

1 Claim, 1 Drawing Sheet

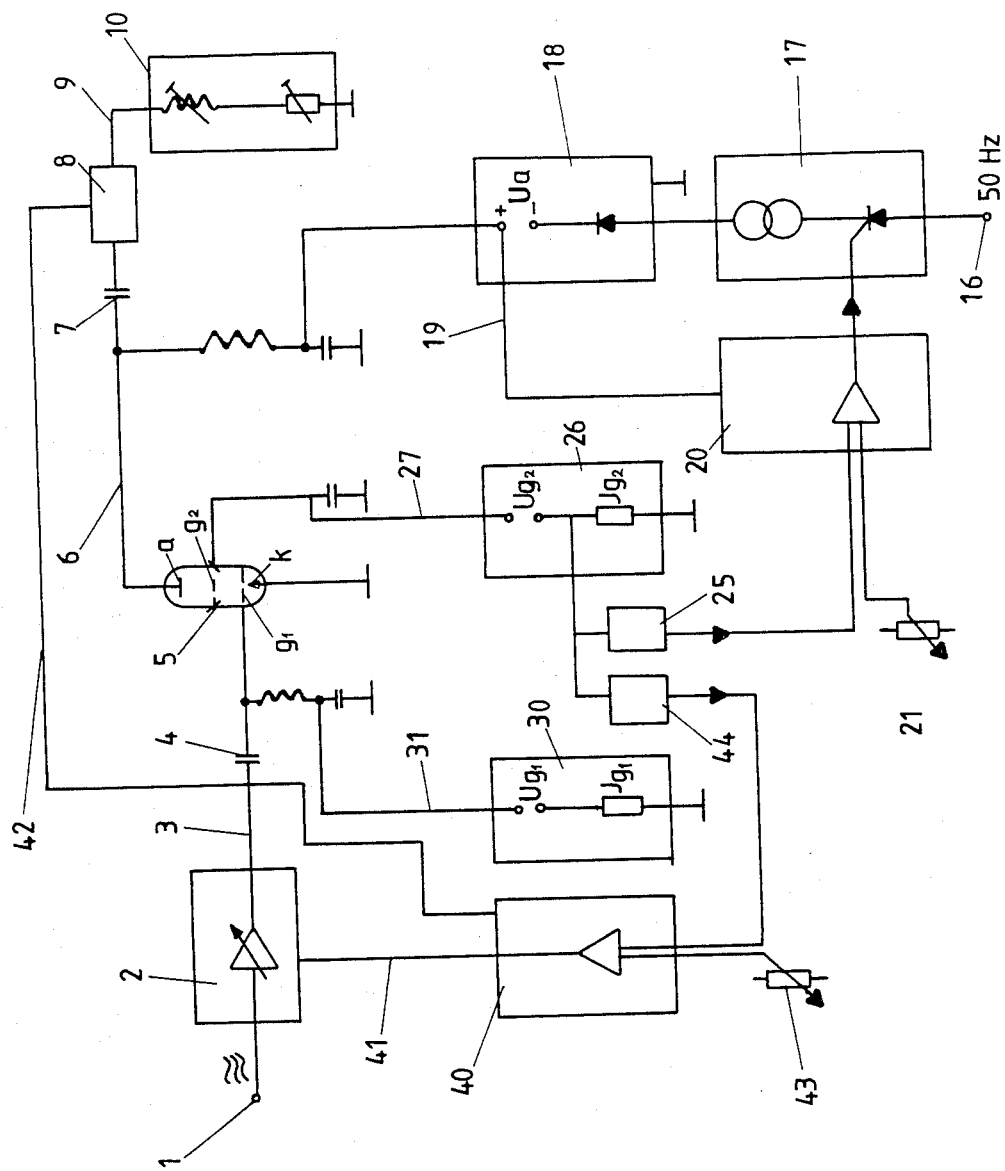

HIGH FREQUENCY AMPLIFIER

BACKGROUND OF THE INVENTION

The present invention relates to a high frequency amplifier for coupling a load with variable operating conditions, particularly a load in form of the plasma to be heated by high frequency energy in an experimental reactor for nuclear fusion, using a tetrode as the amplifier tube and including a regulating circuit with a set point adjuster for regulating the anode voltage.

The operating conditions of the load are determined by the high frequency values, i.e. by the real (that is ohmic) and reactive (capacitive or inductive) components of the load resistance. In the ideal matching case, the load has a purely ohmic resistance without any reactive component.

The mismatching is definable as the standing wave ratio s, i.e. the ratio between the real, outgoing power and the reactive, returning power. In the case of equilibrium thereof $s=\infty$ and in the case of only outgoing power $s=1$.

When using high frequency energy for heating plasma in test reactors for nuclear fusion, frequencies of ion cyclotron resonance are used. These resonant frequencies in existing fusion reactors are in the range 10 to 120 MHz. Very high frequency power is required of the generators for plasma heating and at present roughly 2 MW per generator are required. Transmitting tubes are available which are fundamentally able to provide such power levels. Mainly high power tetrodes are used. However, tetrodes only permit limited power dissipation at their electrodes and the tube is destroyed if this is exceeded.

An important limit for the efficiency of such tubes is the anode power dissipation, which is largely dependent on the mismatching on the tube. This mismatching results from the fact that the reactor plasma to be heated is not constant and instead has widely varying high frequency values during heating. These are transformed by means of the antenna, the coaxial high frequency line, and the matching elements of the generator as mismatching on the tube anode. A real resistance transformed to a corresponding value is considered to be the optimum matching. In addition, the necessary frequency band width of such an amplifier in the case of constant power is made relatively high. For example, this band width is $\pm 2$ MHz at a 50 MHz centre frequency. There can be a mismatching of $s=1.5$ or higher on the connected high frequency line, so that due to the transformation in the anode circuit, the mismatching at the tube can assume values of $s=2.6$ or higher. There are considerable external resistance changes for the transmitting tube for the different phase positions.

The high frequency power of an amplifier stage is calculated from the difference between the power fed in $I_a \times V_a$ and the anode power dissipation. The anode current must be increased as the external resistance decreases, so that a given required power is obtained. Assuming that the anode voltage remains constant, this leads to a rise in the anode power dissipation. However, the permitted anode power dissipation is limited for each tube.

SUMMARY OF THE INVENTION

In the case of a high frequency amplifier of the aforementioned type, the problem of the invention is to ensure that on maintaining a given required power, the anode power dissipation is automatically kept below a limit which is harmful for the tube, as a function of the particular mismatching.

The screen grid current is a measure of the maximum modulation of a tetrode and therefore of the minimum anode power dissipation. The screen grid current comes about if the peak value of the anode a.c. voltage is higher than the difference between the anode voltage and the screen grid voltage. The screen grid current then rises rapidly and starts in part to flow across the screen grid instead of across the anode.

The modulation of a tetrode is an indicator of its efficiency. If the screen grid current is used for adjusting the level of the necessary anode voltage, then under the operating conditions of the tube there is a very simple and effective optimization of the efficiency and a minimization of the anode power dissipation.

On the basis of this consideration, the aforementioned problem is solved in that the control circuit for the anode voltage can also be influenced as a set point feedforward by a control variable dependent on the tetrode screen grid current and used for automatically matching the anode voltage to the operating conditions of the load. Thus, on maintaining the necessary power in the load circuit, there is an automatic limiting of the anode power dissipation to a level which is harmless for the tube.

Such a high frequency amplifier operates completely satisfactorily, provided that the frequency of the energy source used for supplying the anode voltage and which supplies the "internal" control loop setting the anode voltage, is sufficiently large and the control element used for said control loop acts sufficiently rapidly in order to avoid a disturbing time lag between a control instruction and its performance or between the control variable input and the actual value correction of the anode voltage.

However, in practice a disturbing time lag must be expected. The reaction of the control circuit for the anode voltage with the set point or desired value feedforward has a relatively large time constant, which is higher than the thermal time constant of the tube screen. The screen can be damaged if the screen grid power dissipation is greater than its maximum value in continuous operation. However, it is possible to keep the screen grid current and also the anode power dissipation automatically at values which are harmless for the tube by limiting the controlling high frequency power.

However, the use of this measure alone would mean that in the case of a widely varying load there would be no optimum h.f. power withdrawal at the amplifier output and adequate limitation of the anode and screen power dissipation. Thus, if the anode voltage is set to a maximum value corresponding to a high load resistance, then there can be a considerable reduction in the actual load resistance due to the operating conditions of a widely varyable load, such as e.g. plasma to be heated with high frequency energy. This leads to a low anode voltage and a high anode current, so that the anode power dissipation resulting from the power fed in, $I_a \times V_a$ less the high frequency power supplied, exceeds its permitted value.

However, in conjunction with the inventive proposal making it possible on maintaining a required output power to automatically keep the anode power dissipation below a value which could cause damage to the tube, the additional use of a high-speed regulating circuit for limiting the screen grid and anode power dissipation as a function of the controlling high frequency power is advantageous for overcoming the disadvantageous consequences of the aforementioned high time constant of the anode voltage control circuit while maintaining the required output power of the amplifier.

DESCRIPTION OF THE DRAWING AND PREFERRED EMBODIMENT

The invention is described in greater detail hereinafter relative to a non-limiting embodiment and the attached circuit diagram.

DETAILED DESCRIPTION OF A PREFERRED EMBODIMENT

In the circuit of the high frequency amplifier, 1 is the h.f. input, from which the high frequency passes across a preamplifier 2 and a bypass capacitor 4 in input line 3 to a tetrode 5 forming a amplifier tube, whose anode is a, cathode k, control grid $g_1$ and screen grid $g_2$. A line 6 leads from anode a across a bypass capacitor 7 to the h.f. output 8, to which is connected via a line 9 a variable impedance forming load 10, e.g. an antenna coupled to a plasma.

The anode voltage source is connected to line 6; its input connection is 16, a transformer with a thyristor regulating device is 17, a rectifier with a tap connection for the actual anode voltage value is 18, and this is supplied by means of a line 19 to the regulating means 20, in the form of a summing amplifier, which includes an adjusting device 21 for the fixed set point or desired value. Those parts from the "internal" control loop of the anode voltage.

The regulating means 20 has a second input line for feeding a control variable 25 as a set point feedforward. The control variable 25 is obtained from the tap connection 26, in a line 27 connected to screen grid $g_2$ of tetrode 5, as soon as a screen grid current flows or a screen voltage occurs.

Control grid $g_1$ of the tetrode is also connected by a line 31 to a device 30 which makes it possible to establish the magnitude of the control grid bias voltage and the control grid direct current.

There is also a regulating means 40, in the form of a summing amplifier, which is connected by a line 41 to preamplifier 2 and which is used for regulating the controlling high frequency power. Regulating means 40 is also connected by a line 42 to the h.f. output 8 of the amplifier and is provided with a set point adjuster 43. In addition, a control variable 44, dependent on the screen grid current tap 26, is supplied to the regulating means 40 for limiting the high frequency power.

These measures makes it possible to maintain a given required power at the high frequency amplifier output, even in the case of widely varying high frequency values of the load, to limit the power dissipation at the anode and screen grid to values which are harmless for the tube and also avoid the undesired effects of the unavoidable high time constants when using the alternating current network as the energy source for the anode voltage regulating means.

What is claimed is:

1. A high frequency amplifier for coupling a high frequency signal to a variable impedance load, particularly a load in the form of plasma to be heated with high frequency energy in an experimental nuclear fusion reactor, said high frequency amplifier comprising:

a tetrode tube having a cathode adapted for connection to a ground reference voltage source, a control grid, and an anode;

a preamplifier having an input adapted to receive a high frequency signal and having an output coupled to said tetrode control grid;

an output device coupled to said tetrode anode and adapted for connection to a variable impedance load;

an anode control loop including (a) a thyristor having a cathode, an anode adapted for connection to a voltage source, and a control electrode; (b) a transformer having an input connected to said thyristor cathode and having an output; (c) a rectifier having an anode connected to said transformer output and having a cathode coupled to said tetrode anode; (d) a first regulating device having a first input adapted for connection to a first source of adjustable voltage, a second input, a control input coupled to said tetrode anode, and an output connected to said thyristor control electrode for controlling conductivity of said thyristor; (e) a tapped resistor having a first end coupled to said tetrode screen grid and a second end adapted for connection to a ground reference voltage source; and (f) means coupling the tap of said tapped resistor to said first regulating device second input, whereby the conductivity of said thyristor, and thus the tetrode anode voltage, are controlled in accordance with the tetrode screen grid voltage, a second regulating device having a first input adapted for connection to a second source of adjustable voltage, a second input coupled to the tap of said tapped resistor, a first output coupled to said preamplifier for controlling the amplification thereof and a second output coupled to said output device for controlling application of the voltage therefrom to the load; and a second resistor having a first end coupled to said thyristor control grid and a second end adapted for connection to a ground reference voltage source for providing a bias voltage on said control grid.

* * * * *